US012425014B1

United States Patent
Van Ierssel et al.

(10) Patent No.: US 12,425,014 B1
(45) Date of Patent: Sep. 23, 2025

(54) SELF-ALIGNING INTERCONNECT FOR A DIGITAL SYSTEM

(71) Applicant: Movellus Circuits Incorporated, San Jose, CA (US)

(72) Inventors: Marcus Van Ierssel, Toronto (CA); Vikram Karvat, Saratoga, CA (US); Jeffrey Alan Fredenburg, Chicago, IL (US); Brian Che Yuen Lam, Richmond Hill (CA); David Moore, Ann Arbor, MI (US); Saif Elam, Markham (CA)

(73) Assignee: Movellus Circuits Inc., Ann Arbor, MI (US)

( * ) Notice: Subject to any disclaimer, the term of this patent is extended or adjusted under 35 U.S.C. 154(b) by 43 days.

(21) Appl. No.: 18/429,802

(22) Filed: Feb. 1, 2024

Related U.S. Application Data

(60) Provisional application No. 63/442,962, filed on Feb. 2, 2023.

(51) Int. Cl.
*H03K 5/00* (2006.01)
*H03K 5/14* (2014.01)
*H03K 5/24* (2006.01)
*H03K 21/08* (2006.01)

(52) U.S. Cl.
CPC .............. *H03K 5/249* (2013.01); *H03K 5/14* (2013.01); *H03K 21/08* (2013.01)

(58) Field of Classification Search
CPC ..... G06F 1/08; G06F 1/10; G06F 1/12; G06F 1/14; H03K 5/249; H03K 5/14; H03K 21/08
See application file for complete search history.

(56) References Cited

U.S. PATENT DOCUMENTS

| | | | | |
|---|---|---|---|---|
| 6,031,847 A | * | 2/2000 | Collins | H04L 7/10 370/508 |
| 9,521,058 B2 | * | 12/2016 | Pandey | H04B 3/00 |
| 2002/0018537 A1 | * | 2/2002 | Zielbauer | G11C 7/10 375/377 |
| 2006/0050827 A1 | * | 3/2006 | Saeki | H03M 9/00 375/362 |
| 2017/0269630 A1 | | 9/2017 | Kamezawa | |

FOREIGN PATENT DOCUMENTS

WO WO-2011155333 A1 12/2011

* cited by examiner

*Primary Examiner* — Tuan T Lam
(74) *Attorney, Agent, or Firm* — Lance Kreisman; Peninsula Patent Group

(57) ABSTRACT

An integrated circuit (IC) chip includes transmit circuitry including multiple transmitters to launch parallel data in response to a transmit clock signal. The transmit clock signal is based on a reference clock signal. Receiver circuitry includes multiple receivers to receive the parallel data in response to a receive clock signal. The receive clock signal is based on the reference clock signal. Bus circuitry includes multiple data paths arranged in parallel between the transmit circuitry and the receiver circuitry. Each data path is coupled between a given one of the multiple transmitters and a given one of the multiple receivers. A first data path of the multiple data paths includes a delay circuit to dynamically delay first data of the parallel data propagating along the first data path by a first delay that is based on a channel delay exhibited by a second data path of the multiple data paths.

20 Claims, 8 Drawing Sheets

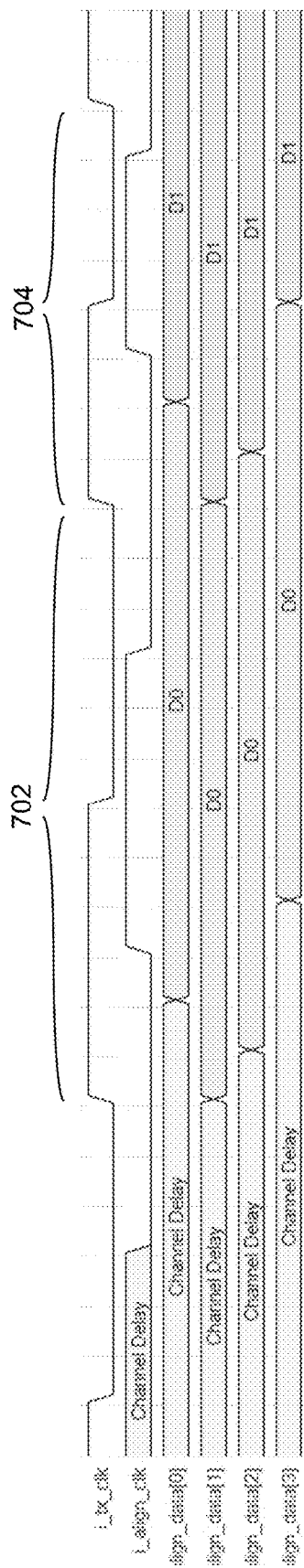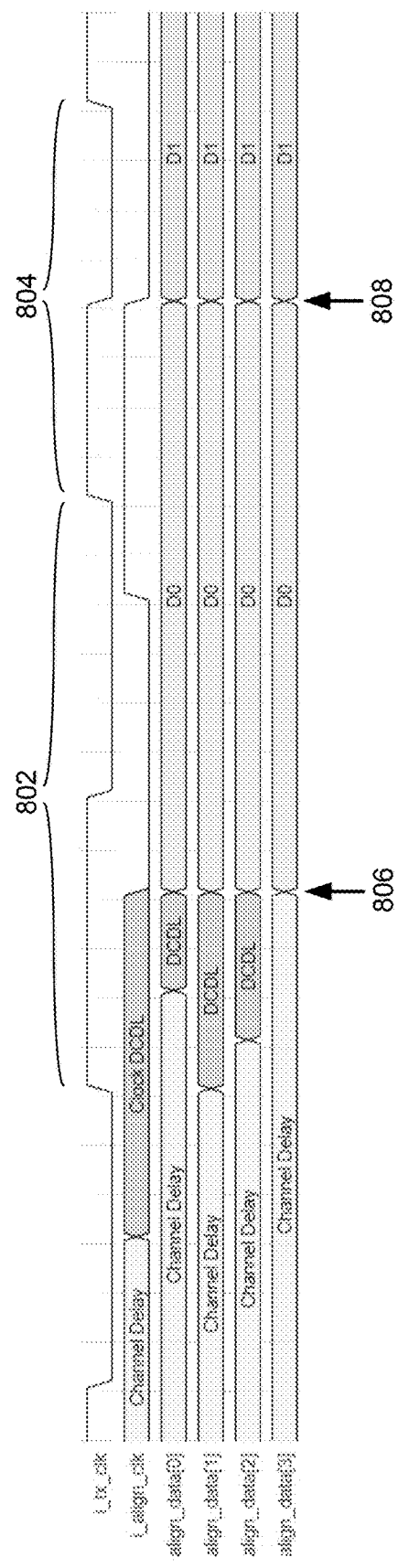

SELF-ALIGNING INTERCONNECT FOR A DIGITAL SYSTEM

CROSS-REFERENCE TO RELATED APPLICATIONS

This application is a Non-Provisional that claims priority to U.S. Provisional Application No. 63/442,962 filed Feb. 2, 2023, entitled SELF-ALIGNING INTERCONNECT, all of which is incorporated herein by reference in its entirety.

TECHNICAL FIELD

The disclosure herein relates to digital systems, subsystems, integrated circuits, and associated methods.

BACKGROUND

Parallel signaling lanes coupled between logic blocks in an integrated circuit are often susceptible to propagation delays that may cause undesirable lane-to-lane timing skew. Existing solutions to address lane-to-lane timing skew often include retiming stages such as flip-flops built along each path to ensure that data along each of the paths arrives in alignment at a common destination. While beneficial in some instances, the use of retiming flip-flop stages may introduce undesirable latency in the lanes.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 7 illustrates a timing chart showing pre-calibration waveforms associated with multiple data lanes of the digital system of FIG. 2.

FIG. 8 illustrates a timing chart showing post-calibrated waveforms associated with the multiple data lanes of the digital system of FIG. 2.

DETAILED DESCRIPTION

Digital systems, subsystems, integrated circuits, and associated methods are disclosed. In one embodiment, an integrated circuit (IC) chip is disclosed. The IC chip includes transmit circuitry including multiple transmitters to launch parallel data in response to a transmit clock signal. The transmit clock signal is based on a reference clock signal. Receiver circuitry includes multiple receivers to receive the parallel data in response to a receive clock signal. The receive clock signal is based on the reference clock signal. Bus circuitry includes multiple data paths that are positioned in parallel between the transmit circuitry and the receiver circuitry. Each data path is coupled between a given one of the multiple transmitters and a given one of the multiple receivers. A first data path of the multiple data paths includes a delay circuit to dynamically delay first data of the parallel data propagating along the first data path by a first delay that is based on a channel delay exhibited by a second data path of the multiple data paths. By using the delay circuit to dynamically delay first data of the parallel data propagating along the first data path by a first delay that is based on a channel delay exhibited by a second data path of the multiple data paths, overall delays associated with the multiple data paths may be matched, allowing the data to be captured without retiming flip-flops. The latency associated with the bus circuitry may thus be significantly reduced.

Figure 1:
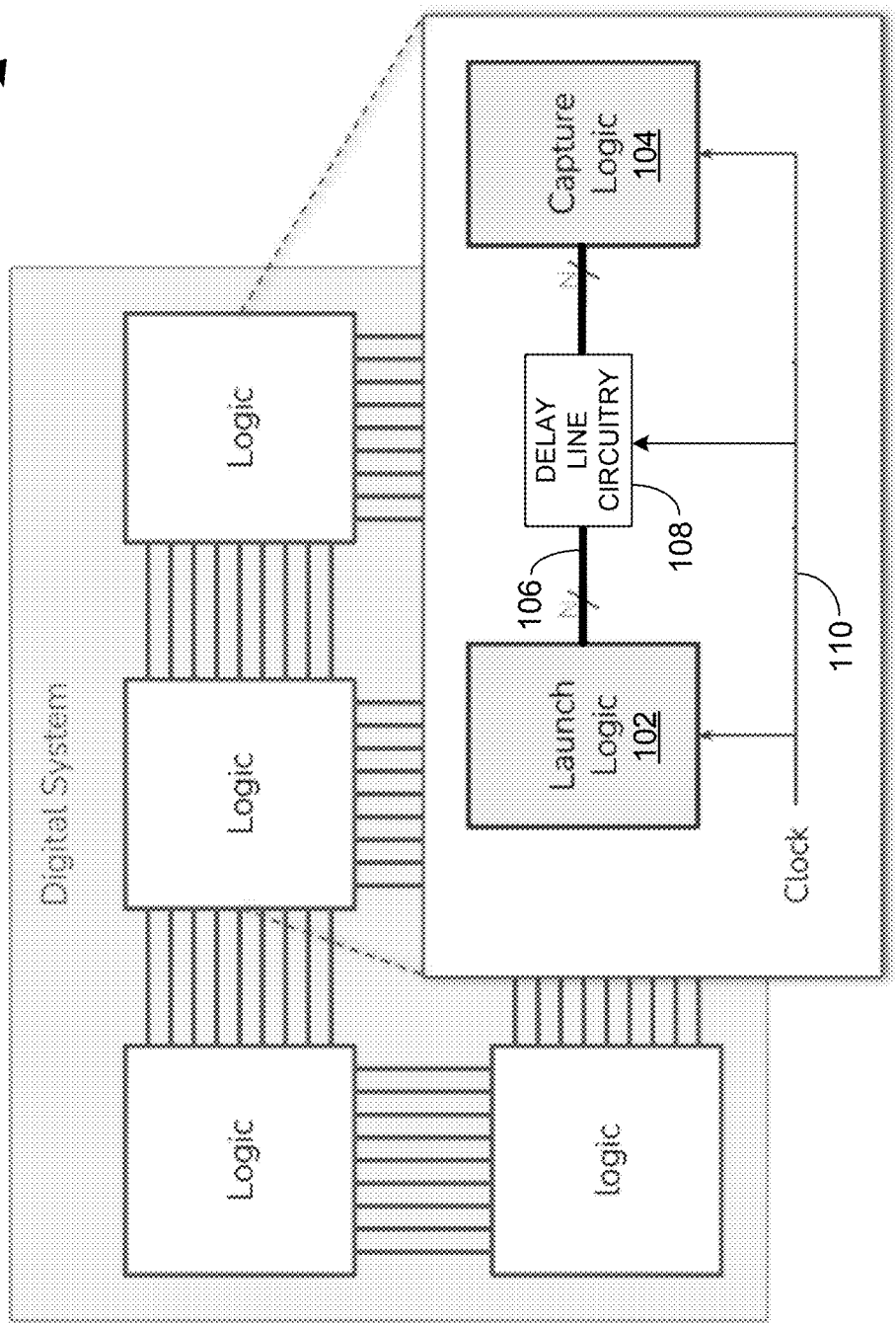
FIG. 1 illustrates one embodiment of a digital system that employs delay line circuitry between launch logic and capture logic.

FIG. 1 illustrates one embodiment of a digital system 100. The digital system 100 generally includes multiple logic subsystems such as launch logic 102 and capture logic 104. A multi-lane parallel bus 106 couples the launch logic 102 to the capture logic 104. For one embodiment, the parallel bus 106 includes multiple data lanes, with each data lane including delay line circuitry 108. A clock lane 110 provides a clock signal that accompanies data transferred along the parallel bus 106. For one embodiment, the clock signal is used as a timing reference for the launch logic 102, the capture logic 104, and the delay line circuitry 108. The delay line circuitry 108 for each of the data lanes 106 dynamically delays the data with respect to the clock on a per-lane basis in a manner that phase aligns the parallel data as-received at the capture logic 104. Incorporating the delay line circuitry 108 eliminates the need for multiple repeater elements, such as flip-flop stages, to be included in each data lane 106. This results in a reduction in latency and timing margin needed to successfully time the digital design.

For one embodiment, the digital system 100 takes the form of circuitry within an integrated circuit (IC) die or chip. Other embodiments may employ the launch logic 102 and the capture logic 104 as separate IC chiplets that may be disposed on a common substrate to form a multi-chip module, with the parallel bus 106 taking the form of a chip-to-chip interconnect. In yet other embodiments, the launch logic 102 and the capture logic 104 may take the form of larger systems with the need to maintain a synchronous relationship.

Figure 2:
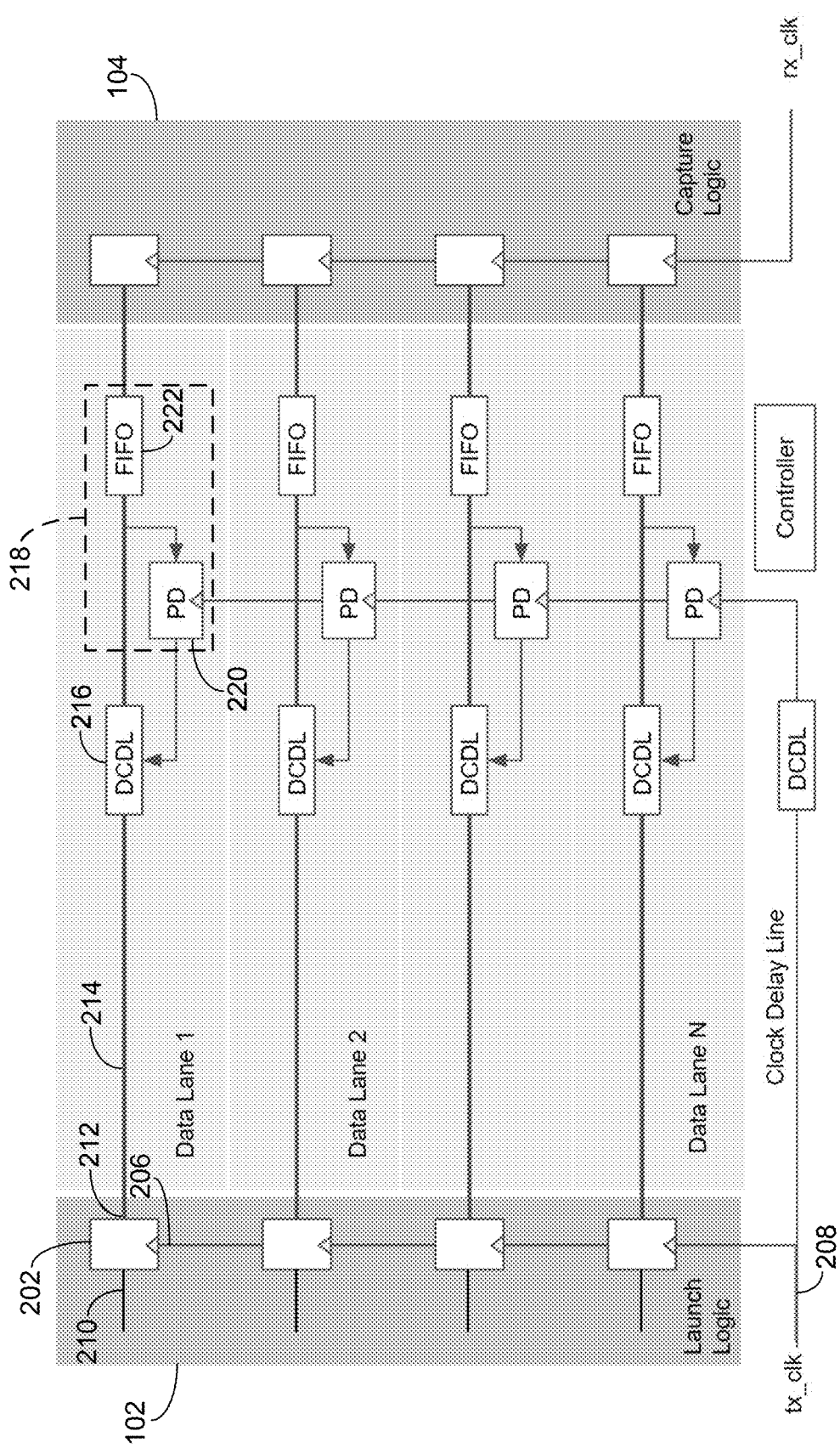
FIG. 2 illustrates further detail for one embodiment of the digital system of FIG. 1.

FIG. 2 illustrates further detail of the digital system 100 of FIG. 1. For one embodiment, the launch logic 102 includes a plurality of data transmitters 202. Each data transmitter 202 includes a timing input 206 that receives a common transmit clock signal tx_clk from a transmit clock path 208. A data input 210 receives data for transmission via a data output 212 in response to a rising edge of the transmit clock signal tx_clk.

Figure 3:
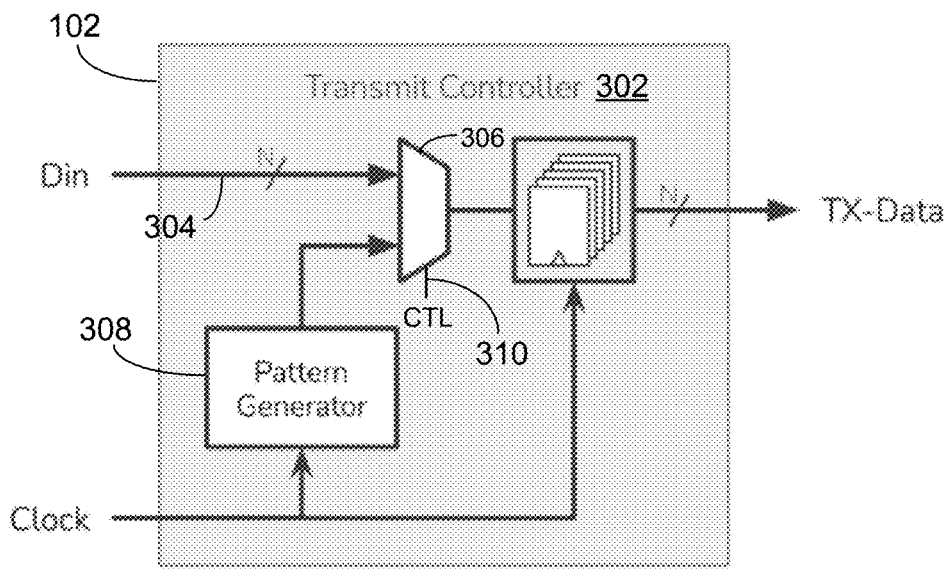
FIG. 3 illustrates one embodiment of a transmit controller used in the digital system of FIG. 2.

FIG. 3 illustrates further detail for one embodiment of the launch logic 102, including a transmit controller 302 that selectively feeds different types of data depending on the mode of operation. The transmit controller 302 includes an input data bus 304 that provides a source of real data Din to a selector 306 for use during a normal or "mission" mode of operation. A pattern generator 308 provides a source of calibration data to the selector for use during a calibration mode of operation. A control input, at 310 provides a control signal CTL from a centralized controller (not shown) to select between the calibration input signals or the actual data signals based on whether the system is operating in the calibration mode of operation or the normal mode of operation. For one embodiment, the pattern generator 308 takes the form of a clock divider circuit that receives the transmit clock signal tx_clk and divides it to create a lower-frequency calibration data signal.

Referring back to FIG. 2, the output of each data transmitter 202 couples to a data lane 214. Depending on the application, each data lane 214 may take the form of a single conductive trace (such as for single-ended configurations) or a dual path conductive trace (such as for differential configurations), and exhibits an intrinsic channel propagation delay based on a variety of characteristics, such as trace length, proximity to adjacent channels, proximity to heat-generating circuitry, among other things. Since each of the data lanes 214 may exhibit unique and potentially different channel propagation delays, without any circuitry to resynchronize data propagating along the multiple lanes 214, lane-to-lane skew may develop such that data that was transmitted at the same transmit clock edge may arrive at the capture logic 104 at a different clock edge.

Figure 4:
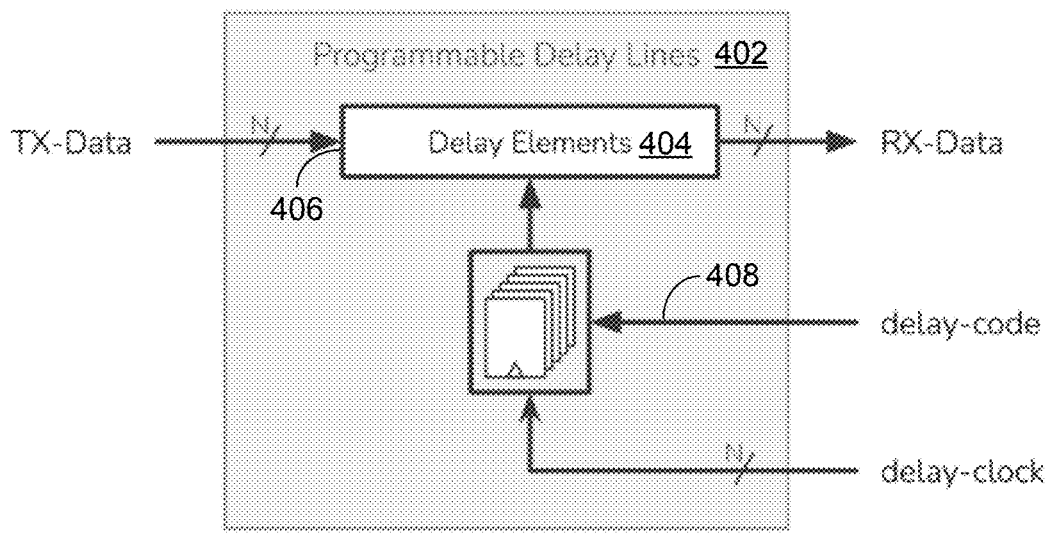
FIG. 4 illustrates one embodiment of the programmable delay lines of FIG. 2.

In an effort to eliminate lane-to-lane skew among the data lanes 214, the delay line circuitry 108 includes separate programmable delay lines 216 that may be coupled to each of the data lanes 214. For one embodiment, each delay line 216 may take the form of a digitally-controlled delay line (DCDL), with specific embodiments shown in FIGS. 4 and 5. As shown in FIG. 4, a given programmable delay line 402 includes multiple delay elements 404 that receive input data, at 406, and apply a selected delay to the data based on a number of the elements being activated by a programmable delay code, at 408. For one embodiment, the delay code is adjusted only when a slower clock edge is received. For some embodiments, the area of the delay line 402 may be minimized by reducing the number of control signal paths. This may be accomplished by using shared control signal paths among the various delay lines 402. Other embodiments may reduce the impact of delay line circuit area by implementing the delay line circuitry beneath the routing channels using lower level metal resources available in the integrated circuit chip.

Figure 5:
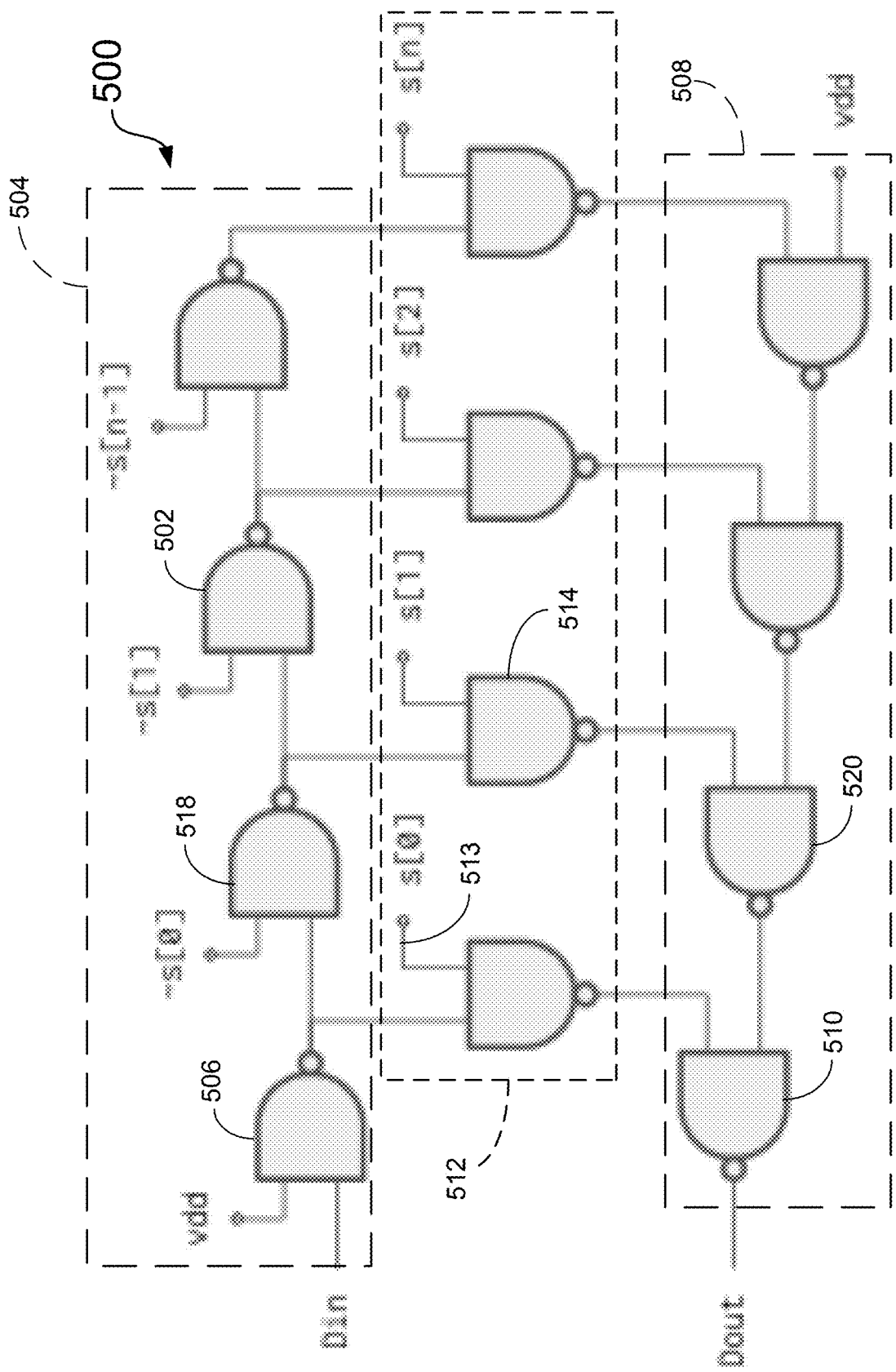
FIG. 5 illustrates further detail for one specific embodiment of a delay line of FIG. 4.

FIG. 5 illustrates one specific embodiment of a digitally-controlled delay line 500 that may be employed by each of the delay lines 216. Each digitally-controlled delay line 500 includes a plurality of delay elements that may take the form of NAND gates 502. A first set 504 of the NAND gates are arranged sequentially in an input row, with a first one 506 of the first set 504 receiving an input signal Din that is NANDed with a fixed voltage level, such as Vdd. A second set 508 of the gates are arranged in an output row, with a last one 510 of the second set 508 producing an output signal Dout that represents a delayed version of the input signal Din, with the amount of delay based on the number of gates activated for the delay path. To establish a delay path, a third set 512 of NAND gates are individually coupled between pairs of NAND gates in the first set 504 and second set 508 that are similarly located. Each of the third set 512 of NAND gates includes a control input, such as at 513, that corresponds to a bit location in a control word. Activation of a given one of the NAND gates of the third set 512 thus shunts the corresponding pair of NAND gates of the first set 504 and the second set 508 to form the programmed delay path.

Further referring to FIG. 5, as an example, if control bit s[1] is asserted, the associated NAND gate, at 514, of the third set 512, will pass the input clock signal Din from the first set 504 to the second set 508. At the same time, the ~s[1] control signal will disable the NAND gate at 502. The activated delay path thus involves the first NAND gate 506 and second NAND gate 518 of the first set 504, the shunting NAND gate 514, and the last NAND gate 510 and second-to-last gate 520 of the second set 508, for a total of five gates of delay. For one embodiment, s[x] is thermocoded such that s[x]=0 for x<n and s[x]=1 for x>=n, where n is the NAND gate number where the first and second sets of gates are shunted.

Figure 6:
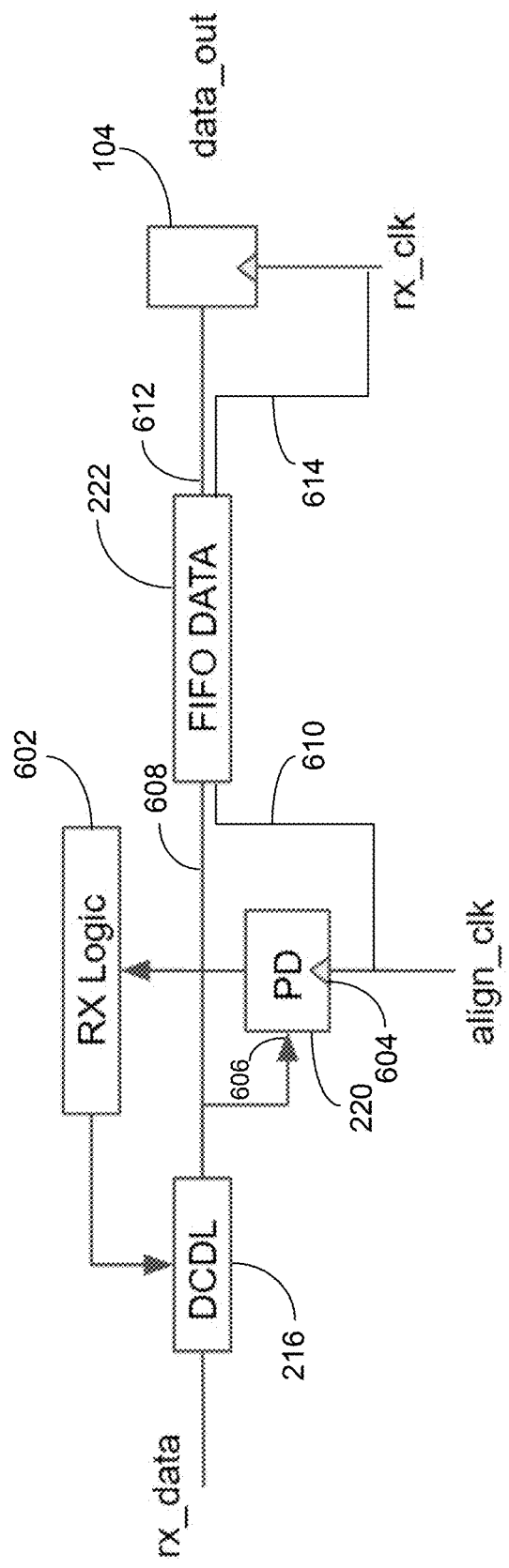
FIG. 6 illustrates further detail of one embodiment of the delay line circuitry of FIG. 2 coupled to receiver logic.

Referring back to FIG. 2, each delay line 216 couples to receiver circuitry 218 that includes a phase detector 220 and a first-in-first-out (FIFO) circuit 222. For some embodiments, at least a portion of the receiver circuitry 218 may be employed in the capture logic 104. Further detail for one specific embodiment of the structural interrelationship between the delay line 216 and the receiver circuitry 218 is shown in FIG. 6. For one embodiment, the receiver circuitry 218 includes receiver control logic 602 that evaluates a phase comparison carried out by the phase detector 220. The phase detector 220 includes an alignment clock input, at 604, to receive an alignment clock signal align_clk. For one embodiment, the alignment clock signal is a delayed version of the transmit clock signal tx_clk. The phase detector 220 also includes a data input, at 606, to receive a copy of the delayed data output from the delay line 216. A phase comparison is performed by the phase detector 220 to determine a phase difference between the delayed data and the alignment clock align_clk. An output signal representing the phase difference is sent by the phase detector 220 to the receiver control logic 602, which generates a digital code for application to the digital delay line 216.

Further referring to FIG. 6, the FIFO 222 includes a write-side data input, at 608, that couples to the output of the delay line 216, and a write clock input, at 610 to receive the alignment clock align_clk. The FIFO 222 also includes a read-side data output, at 612, and a read-side clock input, at 614, to receive the receiver clock signal rx_clk. Since the alignment clock align_clk and the receive clock rx_clk are all part of the transmit clock tx_clk tree, and all have the same origin or source, synchronism is maintained. For one embodiment, the FIFO 222 takes the form of a dual port asynchronous FIFO to buffer the data and absorb delays incurred as a result of frequency changes. The data is written into the FIFO 222 in response to the aligned clock align_clk, while the data is captured by the capture logic 104 in response to the receive clock rx_clk. For some embodiments, the FIFO 222 provides the ability to maintain a fixed system latency as well as absorb jitter and phase shifts due to frequency changes. In some situations, the receiver control logic 602 includes the controls for the FIFO 222, and may be shared between multiple data lanes to minimize area. This may be accomplished by, for example, employing a time-multiplexing technique where one lane performs an alignment during a first portion of an alignment window, and a second lane performs an alignment during a second portion of the alignment window.

In operation, the receiver control logic 602 includes programmable settings for functioning in respective calibration and mission modes. During the calibration mode of operation, configuration logic and calibration logic is employed by the receiver control logic 602 to ensure that skews exhibited between the data lanes are aligned without the effects of aliasing. For one embodiment, this may be accomplished by configuring the digital system in the calibration mode and generating calibration data using the pattern generator. For one embodiment, the frequency of the data generated by the pattern generator is at least as high as the expected frequency of data during the mission mode of operation. As the calibration data is fed to the data lanes and propagates along, lane-to-lane skew is detected by the phase detector and fed to the receive logic controller. The controller determines which data lane has the highest inherent delay, and delays the alignment clock align_clk such that it exhibits a phase that is beyond the slowest data lane. Once the alignment clock align_clk delay is set, then per-lane delay adjustments may be made by applying a delay to a given data lane based on a detected phase difference between the alignment clock and the data. Doing this adjustment individually for the separate data lanes results in an equalization of the per-lane skews that the data for each data lane is aligned with the receive clock rx_clk as received by the capture logic 104.

During the mission mode of operation, the receiver control logic 602 continues adjustments after initial calibration to allow for tracking of static effects (which may be slow relative to the update frequency) such as temperature variation or aging.

For one embodiment, the skew compensation provided by the delay line circuitry 108 tolerates frequency changes by maintaining phase alignment during the frequency changes. Calibrating the system at the highest operating frequency, as noted above, improves this tolerance. Referring now to FIG. 7, during frequency changes, such as where the transmit clock signal tx_clk changes from a first frequency, at 702, to a second frequency, at 704, there may be a short duration where the clock frequency changes are delayed through the delay line before appearing as the alignment clock signal align_clk. This does not pose an issue with the alignment system since the internal FIFO 222 accounts for this transition delay. FIG. 8 illustrates a timing chart with the waveforms of FIG. 7 following calibration with a frequency change in the clock signal, such as at 802 and 804, with lane-to-lane alignment maintained at 806 and 808.

The architecture described above, including the transmit circuitry, channel buffers, delay lines, phase detectors and FIFO registers may all be constructed from standard cells, or from other cells with standard static timing analysis (STA) timing models. In many cases, the described combination of structures can achieve closed timing with normal static timing analysis, with few manual adjustments. Additionally, for sources of on-chip variation which are either static or vary at a rate within the bandwidth of the feedback control system controlling the delay line circuitry, offsets caused by those sources (often referred to as in-band) between launch and capture paths to the phase detector registers may be added back to the overall timing slack, reflecting the static offset cancellation performed by the feedback loop. This presents an accurate worst-case timing analysis without the need to use SPICE of other timing simulations.

In terms of timing analysis flow, regardless of the frequency that the data lanes are run at, a given data transfer from the transmit logic 102 to the capture logic 104 should take a consistent number of clock cycles. In other words, each data lane should exhibit a consistent latency that is independent of frequency. Including the FIFO 222 ensures this independence by providing sufficient buffering capability to, for low frequency situations, allow data to be stored within the FIFO depth (such as, for example, seven cycles of latency), and for high frequency situations, enables faster emptying of the data from the FIFO (such as, for example, a half-cycle of FIFO latency) for the capture logic 104. For some embodiments, the FIFO depth and overall configuration of the circuitry may be based on a range of expected frequency fluctuations that form a boundary of expected operation that still provides successful timing closure.

Figure 9:
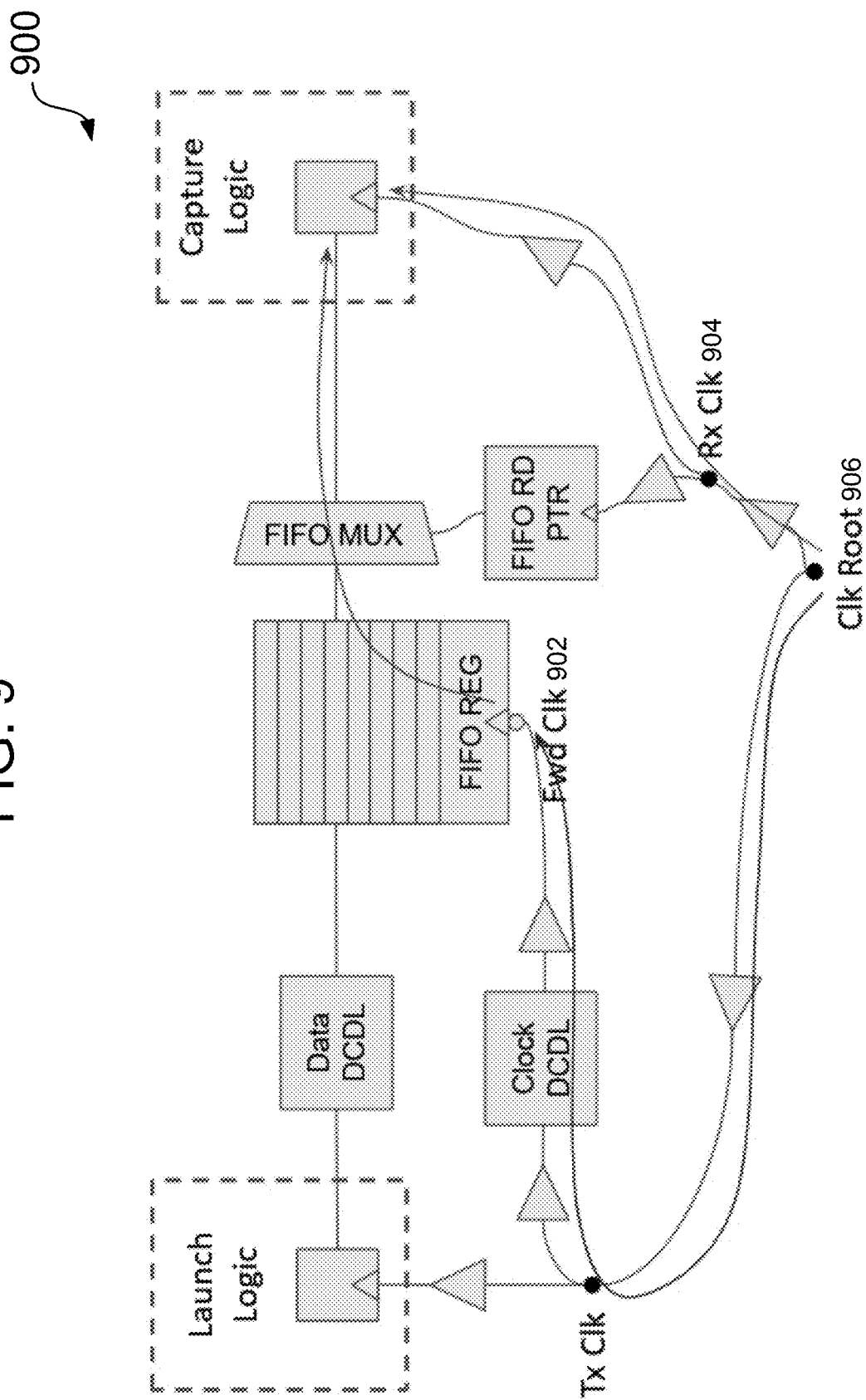
FIG. 9 illustrates a block diagram illustrating how timing is closed between the launch logic and the capture logic of one embodiment of the digital system of FIG. 2.

FIG. 9 illustrates a timing flowchart for one embodiment of a digital system 900 that corresponds to the digital system 100 described above. As explained above, the digital system 100 includes delay line circuitry that is tolerant of frequency changes. For one embodiment, this allows a phase relationship between a forwarded clock signal, such as at 902, and a receiver clock signal, such as at 904, to be considered differently at low and high frequencies. While the two clock signals have an unknown phase difference at a target operating frequency, due to an on-chip variation (OCV) range which is larger than one period, the same is not necessarily true at low frequency. Below a certain frequency, because both clocks originate from the same root, at 906, the phase difference between the two is bounded, and paths between the two points can be analyzed as synchronous paths with static timing analysis (STA) techniques.

Figure 10:
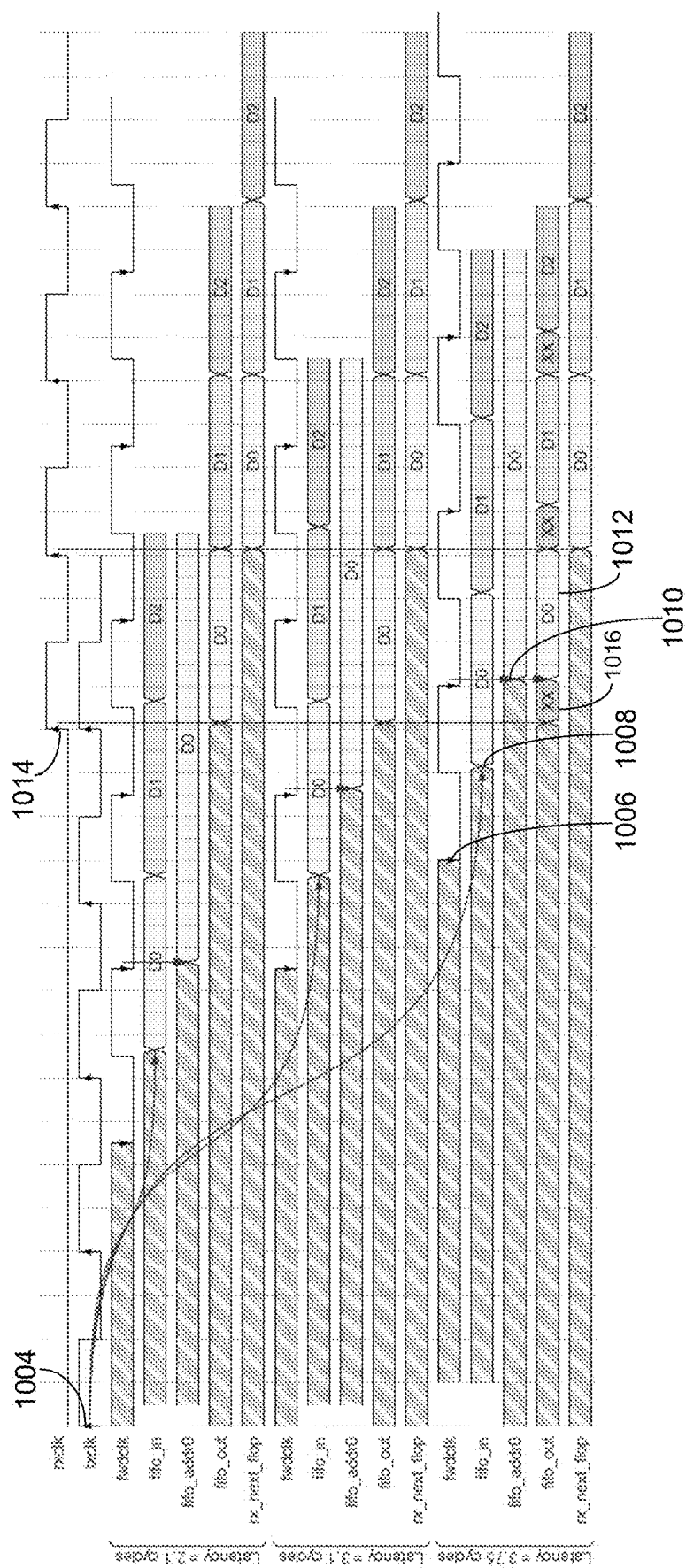
FIG. 10 illustrates a timing chart illustrating various waveforms during a simulation of the digital system of FIG. 2 that corresponds to the block diagram of FIG. 9.

FIG. 10 illustrates three cases of timing waveforms during potential operation of the digital system 900 of FIG. 9. In some circumstances, operation of the FIFO 222 may involve an average fill that is less than one cycle. For the lowermost set of waveforms shown in FIG. 10, at 1002, data is launched at 1004, arrives at the output of the delay line, at 1006, then is sampled into the FIFO, at 1008. If the FIFO is completely empty, because the circuit is as close to running at its maximum frequency, then the receiver controller will adjust its pointer, at 1010, so that the FIFO switches to a new latency path before the data arrives. At 1012, a half cycle following the data being sampled into the FIFO, the FIFO outputs the data. This means that at the beginning of each receiver clock cycle, such as at 1014, the FIFO data is invalid, as shown at 1016. However, as long as the static timing analysis (STA) is closed on the timing path shown by arrows in FIG. 9, the correct data will be captured by the capture logic 104.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments.

Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit (IC) chip, comprising:
  transmit circuitry including multiple transmitters to launch parallel data in response to a transmit clock signal, the transmit clock signal based on a reference clock signal;
  receiver circuitry including multiple receivers to receive the parallel data in response to a receive clock signal, the receive clock signal based on the reference clock signal; and
  bus circuitry including multiple data paths arranged in parallel between the transmit circuitry and the receiver circuitry, each data path coupled between a given one of the multiple transmitters and a given one of the multiple receivers, wherein a first data path of the multiple data paths includes a delay circuit to dynamically delay first data of the parallel data propagating along the first data path by a first delay that is based on a channel delay exhibited by a second data path of the multiple data paths.

2. The IC chip of claim 1, wherein:
  the first delay corresponds to a difference between a first channel delay of the first data path and a second channel delay of the second data path.

3. The IC chip of claim 1, wherein the delay circuit includes:
  a delay line to apply the first delay to the first data to generate first delayed data;
  a phase detector to compare the first delayed data to a timing signal, the phase detector to generate a control signal based on the comparison for adjusting the first delay; and
  first-in-first-out (FIFO) circuitry coupled to the delay line and the phase detector to buffer the first delayed data prior to being received by the receiver circuitry.

4. The IC chip of claim 3, further comprising:
  a clock delay circuit to dynamically delay the transmit clock signal to generate the timing signal.

5. The IC chip of claim 3, wherein the delay line comprises:
  a digitally-controlled delay line of multiple delay elements.

6. The IC chip of claim 3, wherein the FIFO circuitry comprises:
  a dual-port asynchronous FIFO having a programmable depth corresponding to an overall delay of the first data path.

7. The IC chip of claim 1, wherein the transmit circuitry further includes:
  pattern generation circuitry to generate calibration data during a calibration mode of operation.

8. The IC chip of claim 7, wherein the pattern generation circuitry comprises:
  clock divider circuitry to generate the calibration data.

9. The IC chip of claim 1, wherein:
  the bus circuitry is configured without repeating flip-flop circuitry.

10. An integrated circuit (IC) chip, comprising:
  a first data lane including
    a first transmitter to launch first data in response to a transmit clock signal, the transmit clock signal based on a reference clock signal;
    a first receiver to receive the first data in response to a receive clock signal, the receive clock signal based on the reference clock signal;
    a first data path coupled between the first transmitter and the first receiver, the first data path including a first delay circuit to dynamically delay the first data propagating along the first data path by a first delay;
  a second data lane including
    a second transmitter to launch second data in response to the transmit clock signal;
    a second receiver to receive the second data in response to the receive clock signal; and
    a second data path coupled between the second transmitter and the second receiver, the second data path including a second delay circuit to dynamically delay the second data propagating along the second data path by a second delay that is free to be different than the first delay.

11. The IC chip of claim 10, further comprising:
  a third data lane;

wherein the first delay is based on a difference between a first channel delay exhibited by the first data lane and a second channel delay exhibited by the third data lane; and wherein the second delay is based on a difference between a third channel delay exhibited by the second data lane and the second channel delay exhibited by the third data lane.

12. The IC chip of claim 10, wherein the first delay circuit includes:
   a first delay line to apply the first delay to the first data to generate first delayed data;
   a first phase detector to compare the first delayed data to a timing signal, the phase detector to generate a control signal based on the comparison for adjusting the first delay; and
   first-in-first-out (FIFO) circuitry coupled to the first delay line and the first phase detector to buffer the first delayed data prior to being received by the first receiver.

13. The IC chip of claim 12, further comprising:
   a clock delay circuit to dynamically delay the transmit clock signal to generate the timing signal.

14. The IC chip of claim 12, wherein the FIFO circuitry comprises:
   a dual-port asynchronous FIFO having a programmable depth corresponding to an overall delay of the first data path.

15. The IC chip of claim 14, wherein:
   the first data path and the second data path are configured without repeating flip-flop circuitry.

16. A digital system, comprising:
   multiple data lanes, each data lane including
      a transmitter to launch data in response to a transmit clock signal, the transmit clock signal based on a reference clock signal;
      a receiver to receive the data in response to a receive clock signal, the receive clock signal based on the reference clock signal;
      a data path coupled between the transmitter and the receiver, the data path including a delay circuit to dynamically delay the data propagating along the data path by an applied delay that is based on a worst-case channel delay exhibited by a second data path of the multiple data lanes.

17. The digital system of claim 16, wherein:
   the applied delay corresponds to a difference between a channel delay of the data path and the worst-case channel delay of the second data path.

18. The digital system of claim 16, wherein the delay circuit includes:
   a delay line to apply the applied delay to the data to generate first delayed data;
   a phase detector to compare the first delayed data to a timing signal, the phase detector to generate a control signal based on the comparison for adjusting the first delay; and
   first-in-first-out (FIFO) circuitry coupled to the delay line and the phase detector to buffer the first delayed data prior to being received by the receiver.

19. The digital system of claim 18, further comprising:
   a clock delay circuit to dynamically delay the transmit clock signal to generate the timing signal.

20. The digital system of claim 18, wherein the FIFO circuitry comprises:
   a dual-port asynchronous FIFO having a programmable depth corresponding to an overall delay of the data path.

* * * * *